United States Patent
Lin et al.

(10) Patent No.: US 10,985,764 B1
(45) Date of Patent: Apr. 20, 2021

(54) PHASE DETECTOR OFFSET TO RESOLVE CDR FALSE LOCK

(71) Applicant: XILINX, INC., San Jose, CA (US)

(72) Inventors: Winson Lin, San Francisco, CA (US); Jin Namkoong, San Jose, CA (US); Hongtao Zhang, San Jose, CA (US)

(73) Assignee: XILINX, INC., San Jose, CA (US)

( * ) Notice: Subject to any disclaimer, the term of this patent is extended or adjusted under 35 U.S.C. 154(b) by 0 days.

(21) Appl. No.: 16/918,854

(22) Filed: Jul. 1, 2020

(51) Int. Cl.
*H04L 7/00* (2006.01)
*H04L 7/033* (2006.01)
*H04L 25/03* (2006.01)
*H03L 7/087* (2006.01)
*H03L 7/08* (2006.01)

(52) U.S. Cl.
CPC .......... *H03L 7/087* (2013.01); *H03L 7/0807* (2013.01); *H04L 7/0037* (2013.01); *H04L 7/0041* (2013.01)

(58) Field of Classification Search
None
See application file for complete search history.

(56) References Cited

U.S. PATENT DOCUMENTS

| | | | | |
|---|---|---|---|---|
| 8,090,755 B1 * | 1/2012 | Old | ........................ | G06F 1/022 708/271 |
| 8,923,463 B1 | 12/2014 | Jenkins et al. | | |
| 8,942,334 B1 * | 1/2015 | Zortea | ..................... | H03L 7/107 375/355 |
| 8,958,513 B1 | 2/2015 | Novellini et al. | | |
| 8,964,924 B2 * | 2/2015 | Calabro | ................ | H03L 7/0807 375/371 |
| 9,065,601 B1 | 6/2015 | Jenkins et al. | | |
| 9,209,960 B1 | 12/2015 | Leung et al. | | |
| 9,244,885 B1 * | 1/2016 | Old | ....................... | G06F 1/0328 |
| 9,294,260 B2 * | 3/2016 | Giaconi | ................ | H04L 7/0041 |
| 9,306,730 B1 | 4/2016 | Shu et al. | | |
| 9,313,017 B1 | 4/2016 | Liao et al. | | |
| 9,356,775 B1 | 5/2016 | Xu et al. | | |
| 9,378,720 B2 | 6/2016 | Roebke | | |
| 9,379,880 B1 | 6/2016 | Xu et al. | | |
| 9,438,409 B1 | 9/2016 | Liao et al. | | |
| 9,455,848 B1 | 9/2016 | Zhang et al. | | |
| 9,484,939 B2 * | 11/2016 | Luo | ...................... | H03L 7/1976 |
| 9,698,970 B1 | 7/2017 | Cho | | |

(Continued)

OTHER PUBLICATIONS

Baprawski, J. (Mar. 22, 2012), "SerDes System CTLE Basics", retrieved from https://johnbaprawski.com/wp-content/uploads/2012/04/SerDes_System_CTLE_Basics.pdf, 10 pages.

(Continued)

*Primary Examiner* — Kenneth B Wells
(74) *Attorney, Agent, or Firm* — Patterson + Sheridan, LLP

(57) ABSTRACT

An example method of clock and data recovery (CDR) includes adding a pre-defined offset to an output of a phase detector (PD) of a CDR circuit, and loading an accumulator of a frequency loop of the CDR circuit with a pre-defined load value. The method further includes detecting the phase of an incoming signal using a PD, and determining that the CDR has locked onto a real lock point. In some examples, the method further includes determining that the CDR has locked on a real lock point, and, in response to the determination, modifying the pre-defined offset to equal zero.

20 Claims, 7 Drawing Sheets

(56) References Cited

U.S. PATENT DOCUMENTS

| | | |
|---|---|---|
| 9,882,703 B1 | 1/2018 | Xu et al. |
| 9,960,902 B1 | 5/2018 | Lin et al. |
| 10,038,545 B1 | 7/2018 | Wu et al. |
| 10,224,937 B1 | 3/2019 | Wu et al. |
| 10,256,968 B1 | 4/2019 | Wu et al. |
| 10,484,167 B2 | 11/2019 | Zhuang et al. |

OTHER PUBLICATIONS

Ismail, Kareem et al., "Design and Implementation of CDR and SerDes for High Speed Optical Communication Networks Using FPGA", 2016 18th International Conference on Transparent Optical Networks (ICTON), 2016, pp. 1-3.

Understanding and Characterizing Timing Jitter, retrieved from https://www.tek.com/primer/understanding-and-characterizing-timing-jitter-primer, 24 pages.

Ghiasi, Ali et al., "Complementary Transmitter and Receiver Jitter Test Methodology", IEEE 802.3bm Task Force, Mar. 2014, 14 pages.

\* cited by examiner

PHASE DETECTOR OFFSET TO RESOLVE CDR FALSE LOCK

TECHNICAL FIELD

Examples of the present disclosure generally relate to electronic circuits and, in particular, to the addition of an offset to a clock and data recovery (CDR) phase detector output to resolve false lock issues.

BACKGROUND

High-speed data communication systems frequently rely on circuits within the receiver rather than transmitting a reference clock with the data. For example, serial data communication may include the use of a serializer-deserializer (SerDes) at each end of a communication link. Within a SERDES, a CDR may extract a clock that is embedded in the incoming data stream. Once the dock is recovered, it may then be used to sample the incoming data stream to recover individual bits.

In baud-rate CDR ADC-based SerDes, it is possible to encounter false CDR lock scenarios. An example of false lock is, for example, when the system operates at 200 ppm but the CDR second-order loop converges stably (in a false lock) at 100 ppm instead of 200 ppm. For example, if a transmitter sends out data at 32 Gbps, and a receiver tuned to the data signal samples at 32.0064 Gbps due to different crystals used between the transmitter and the receiver, there is a $2.0 \times 10^{-4}$, or 200 ppm difference between the transmitter and the receiver. Because of this frequency difference, a phase detector (PD) of the CDR will output a net positive value over time, and thereby move the clock edge to the right, to slow down the receiver's sampling clock. The second order loop of the CDR will accumulate, and eventually the PD output will go to 0. Usually, and ideally, the second order loop accumulates towards a 200 ppm equivalent, and the PD output becomes 0. However, due to channel/periodic jitter/high latency, the PD profile may have some gaps where when the second order loop accumulates to 100 ppm, the PD output averages to 0. When this occurs, the CDR gets stuck at 100 ppm, and, as a result, the receiver samples at the still too fast rate of 32.0032 Gbps and not the actual correct rate of 32 Gbps. Since there is a mismatch in the TX/RX frequency, eventually bit errors will occur. Moreover, it is not a trivial task to determine if there is a true or a false CDR lock, as in both cases the CDR converges in the same way.

One conventional solution to avoid false lock is to reduce data path latency. However, even when this technique is applied, there is a limit as to how much of a reduction can be achieved.

What is desired is an improved apparatus and method to detect and/or prevent false lock.

SUMMARY

Techniques for resolving false lock in a clock and data recovery circuit are described. In an example, a method of CDR includes adding a pre-defined offset to an output of a phase detector (PD) of a CDR circuit, initializing an accumulator of a frequency loop of the CDR circuit with a pre-defined load value, detecting the phase of an incoming signal using the PD, and determining that the CDR has locked on a real lock point.

In another example, the method further includes, in response to a determination that the CDR has locked onto a real lock point, removing the PD offset.

In another example, a clock and data recovery (CDR) circuit includes an input configured to receive an incoming digital signal, a phase detector (PD) loop coupled to the input, configured to detect a phase of the incoming signal and generate a PD output, and a summer coupled to the output of the phase loop, configured to add a pre-defined offset to the PD output. The CDR circuit further includes a frequency loop coupled to the PD loop, configured to receive and accumulate the PD output, as offset, over a plurality of samples of the digital signal.

In another example, the CDR circuit further includes circuitry configured to determine that the CDR circuit locked on a real lock point.

In another example, the CDR circuit further includes circuitry configured to, in response to a determination that the CDR locked on a real lock point, modify the pre-defined offset to equal zero.

These and other aspects may be understood with reference to the following detailed description.

BRIEF DESCRIPTION OF THE DRAWINGS

So that the manner in which the above-recited features can be understood in detail, a more particular description, briefly summarized above, may be had by reference to example implementations, some of which are illustrated in the appended drawings. It is to be noted, however, that the appended drawings illustrate only typical example implementations and are therefore not to be considered limiting of its scope.

To facilitate understanding, identical reference numerals have been used, where possible, to designate identical elements that are common to the figures. It is contemplated that elements of one example may be beneficially incorporated in other examples.

DETAILED DESCRIPTION

Figure 1:
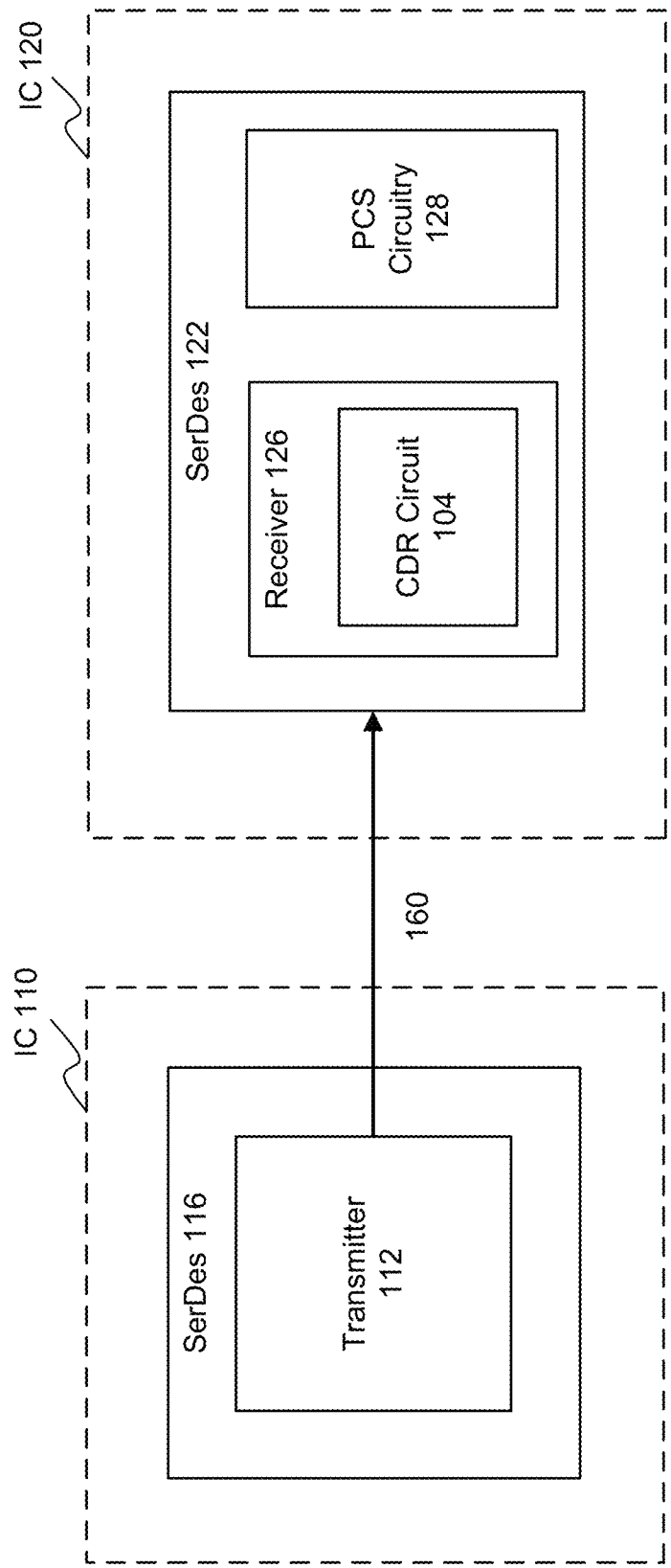
FIG. 1 is a block diagram depicting an example of a serial communication system, according to an example.

Various features are described hereinafter with reference to the figures. It should be noted that the figures may or may not be drawn to scale and that the elements of similar structures or functions are represented by like reference numerals throughout the figures. It should be noted that the figures are only intended to facilitate the description of the features. They are not intended as an exhaustive description of the claimed invention or as a limitation on the scope of the claimed invention. In addition, an illustrated example need not have all the aspects or advantages shown. An aspect or an advantage described in conjunction with a particular example is not necessarily limited to that example and can be practiced in any other examples even if not so illustrated or if not so explicitly described.

As noted above, in baud-rate CDR ADC-based SerDes, it is possible to encounter false CDR lock scenarios. An example of a false lock is when a system ppm is actually 200 ppm but the CDR second-order loop stably converges to 100 ppm, instead of 200 ppm. The stable convergence not being at the true system value, the convergence or "lock" is said to be false. It is noted that it is not a trivial matter to determine if a CDR lock is true or false, inasmuch as in both cases the CDR circuitry converges in the same manner.

As noted above, a conventional solution to avoid a false lock situation is to reduce data path latency. However, there is a limit as to how much reduction can be achieved. Accordingly, in one or more examples, methods that directly target how the data path latency creates dead zones that cause false locks are presented.

Figure 2:
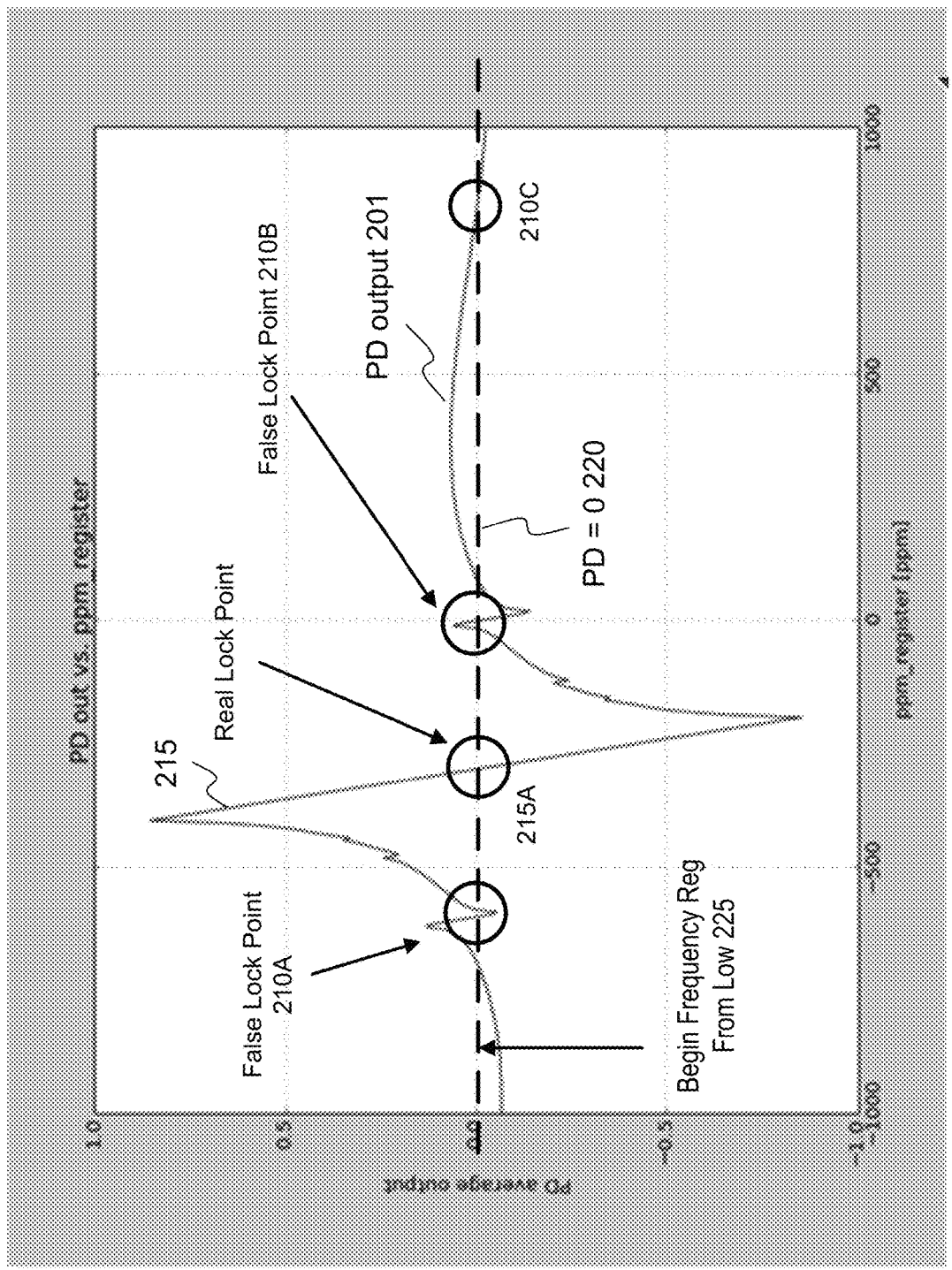
FIG. 2 is an example plot of average phase detector (PD) output versus ppm injected into a second-order accumulator, according to an example.
Figure 3:
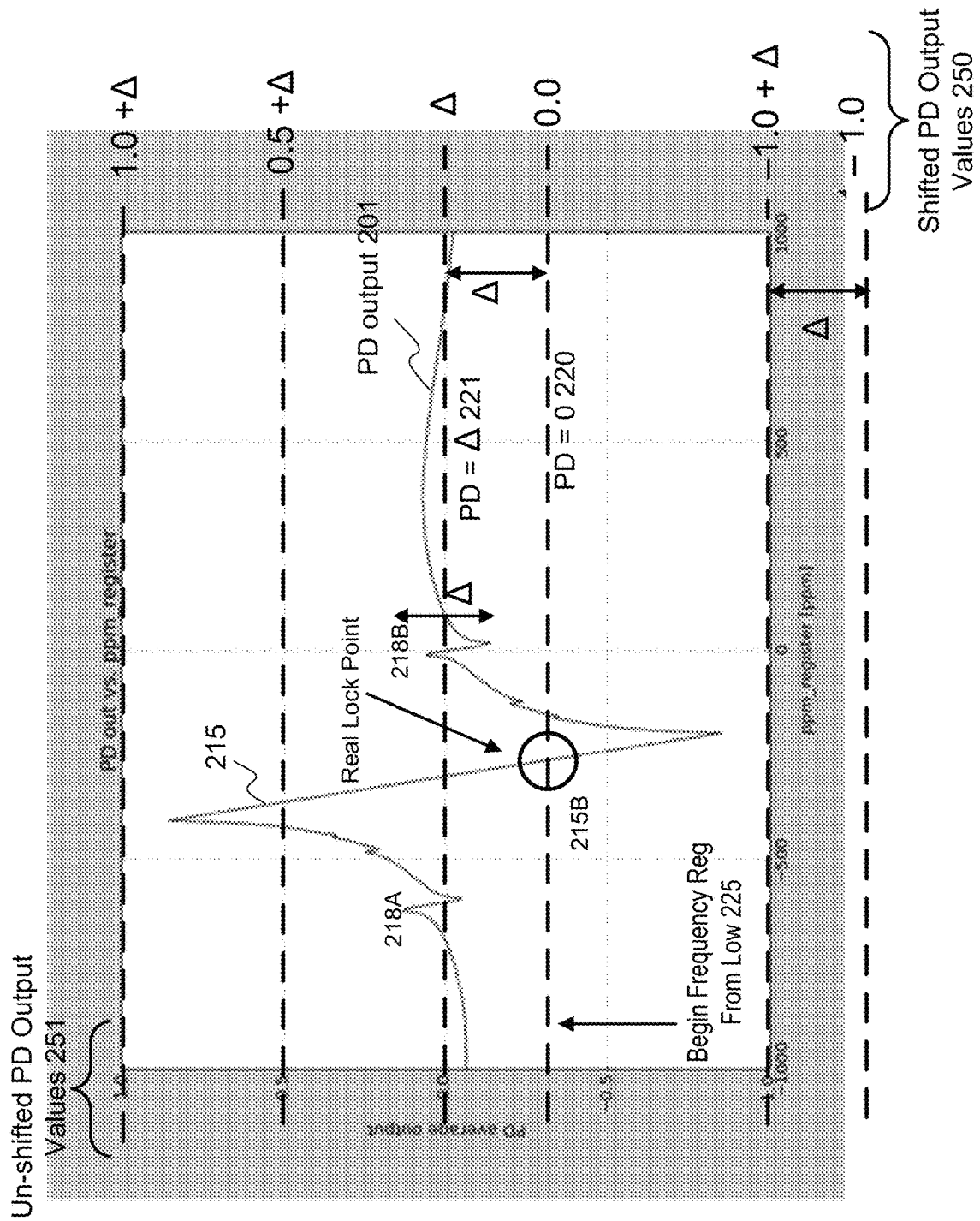
FIG. 3 depicts the example plot of FIG. 2, after adding a PD offset, according to an example.

In the description that follows, it is assumed that a receiver is provided with CDR circuitry. The CDR circuitry includes a first order, or phase, loop, configured to detect the phase of an incoming sample of a digital signal. As used herein, the output of the phase loop is known as a "phase detector output." In one or more examples, an offset may be added to the PD output, so as to shift the PD average output curve (as shown in FIG. 2) upwards, or in the positive direction, as shown in FIG. 3. In one or more examples, such a PD output offset, coupled with an initial load to a second-order accumulator of the CDR circuitry, may resolve ppm false lock issues often seen in baud-rate CDR ADC-based SerDes. In one or more examples, such an added offset may further double as a bias to adjust the CDR locking point to either the left or the right of the natural locking point.

It is noted that a "natural" or converged locking point of a CDR circuit refers to a locking point of the sampling clock after the loop has converged, which is generally around the center of an eye as depicted in an eye diagram for the circuit. That point may or may not be the ideal locking point, depending on the shape of the eye. In one or more examples, based on silicon results, the eye shape, as well as the average converged locking point, may be observed without a PD bias, and then the converged locking point for the CDR may be moved by injecting a PD bias.

It is further noted that while an ideal locking point is the one that gives the lowest bit-error rate, a converged locking point is simply what the loop converges to. Thus, a converged locking point may be false, and thus completely off, or it may be real, e.g., ideal or close to ideal. In one or more examples, whether the converged locking point is a false locking point or a real locking point may be determined.

FIG. 1 is a block diagram depicting an example of a serial communication system 100. The serial communication system 100 comprises a transmitter 112 coupled to a receiver 126 over transmission medium 160. The transmitter 112 can be part of a serializer-deserializer (SerDes) 116. The receiver 126 can be part of a SerDes 122. The transmission medium 160 comprises an electrical path between the transmitter 112 and the receiver 126 and can include printed circuit board (PCB) traces, vias, cables, connectors, decoupling capacitors, and the like. The receiver of the SerDes 116, and the transmitter of the SerDes 122, are omitted for clarity. In some examples, the SerDes 116 can be disposed in an integrated circuit (IC) 110, and the SerDes 122 can be disposed in an IC 120.

The transmitter 112 drives serial data onto the transmission medium 160 using a digital baseband modulation technique. In general, the serial data is divided into symbols. The transmitter 112 converts each symbol into an analog voltage mapped to the symbol. The transmitter 112 couples the analog voltage generated from each symbol to the transmission medium 160. In some examples, the transmitter 112 uses a binary non-return-to-zero (NRZ) modulation scheme. In binary NRZ, a symbol is one bit of the serial data and two analog voltages are used to represent each bit, where one voltage is −A (logic 0) and the other voltage is +A (logic 1). In other examples, transmitter 112 may use a pulse amplitude modulation (PAM) modulation scheme, such as, for example, PAM-4 which uses +3 A, +1 A, −1 A, and −3 A voltages to represent logical 3, 2, 1 and 0, respectively, and thus four voltages to represent two bits. In other examples, the transmitter uses multi-level digital baseband modulation techniques, such as pulse amplitude modulation (PAM), where a symbol includes a plurality of bits of the serial data and more than two analog voltages are used to represent each bit.

The receiver 126 generally includes a clock and data recovery (CDR) circuit 104. The receiver 126 receives an analog signal from the transmission medium 160. The CDR circuit 104 operates to recover data and a clock from the analog signal. The receiver 126 provides the recovered data to physical coding sublayer (PCS) circuitry 128 in SerDes 122 for decoding and further processing.

FIG. 2 is an example plot of average phase detector output 201 vs. ppm injected in a second-order accumulator of an example system with −300 ppm. In FIG. 2, the X-axis represents the value that the second-order accumulator is fixed to and the Y-axis represents the long-term average phase detector output over 10,000 samples of the incoming signal. The example plot of FIG. 2 thus shows the expected behavior at each accumulator state in a system with −300 ppm. Thus, if the CDR circuit is loaded with −300 ppm in the second order accumulator (element 342 shown in FIG. 4, described below), the average PD output is 0. However, as shown in FIG. 2, the average PD output is also 0 at each of false lock points 210A (x value of −600 ppm) and 210B (x value of 0 ppm). As a result, if the accumulator is started at 0 ppm, then the accumulator will simply get stuck at 0 ppm, and not move to have a negative accumulated value, given that the PD output will average to 0 at that point, even though ideally the CDR should accumulate to −300 ppm.

It is noted that the example plot shown in FIG. 2 may be generated by loading and holding the accumulator value to find the average PD output at each X-axis value. However, of course, in regular operation, the accumulator is not held, but allowed to move based on the PD output. In one or more examples, assuming there are no kinks, and thus no false lock points (such as 210A and 210B), the accumulator is initialized to 0 ppm, and, as shown in the plot for the example of FIG. 2, the average output of the PD is close to 0 ppm or less than 0 ppm. Because the PD output is negative, it will cause the accumulator to accumulate in the negative direction. The accumulator has a built in filter inside, so, as noted, it accumulates based on average PD output over thousands of samples, as opposed to instantaneous PD output. Eventually it will accumulate to −300 ppm (at point 215A) when the PD output will average to be positive. At that point, the accumulator will dither between −301 ppm, −300 ppm, and −299 ppm. On the other hand, if, in a different example, the system is at +300 ppm, then the plot would be a mirror image of plot 201 flipped about the line x=0. If that example system is initialized at 0 ppm, and, there being no kinks, it will accumulate positive values over time and move to the right, finally converging at +300 ppm.

As shown in FIG. 2, the points where the plot of PD output 201 intersects the horizontal line y=0 220, which is drawn where the PD output is 0.0, are the stable locking points of the system. As shown, there are three stable lock points, 210A, 215A and 210B, but they are of different types. Each lock point occurs where the PD output=0 line 220 intersects a straight diagonal line in the shape of a "backslash", where the diagonal line runs between either a local maximum and a local minimum of the PD output 201, or between an absolute maximum and an absolute minimum of the PD output 201. Due to the fact that the diagonal line at each of the three lock points runs from a high PD value to a low one, from any point on the diagonal line the system's PD output will be pulled to the point where PD=0, and thus the system will lock at each of those lock points. The problem is, as noted, that two of them, 210A and 210B are false lock points, and need to be avoided. This is because, as noted above, running the CDR at the wrong frequency will cause bit errors. The actual or "true" lock point is at the intersection of horizontal line 220 where PD=0 and diagonal line 215, at point 215A, which is the correct frequency of −300 ppm for this system. This point is midway between the absolute maximum and the absolute minimum values of the PD output 201 for this CDR circuit, which are the top and bottom of line 215, as shown. Thus, anything slightly to the left or the right of the correct frequency will induce a big response, because such a point is only slightly wrong, so the response is clear. When a point is farther away from the correct frequency, and coupled with periodic jitter noise, the response is not as strong, and the periodic noise could induce a false response, which may then result in the false lock points 210A and 210B. The smaller ranged diagonal lines at false lock points 210A and 210B are known as "kinks", and run between local minima and maxima, as shown, but are significantly smaller in range than the absolute minimum and maximum values for the CDR circuit, which are found at the top and bottom of diagonal line 215, as noted above.

Continuing with reference to FIG. 2, in normal operation of the CDR circuit, if the circuit is initialized at 0 ppm in the second-order accumulator (e.g., in the center of the X-axis of the plot of FIG. 2), the accumulator should ideally accumulate negative values and move towards −300 ppm. However, as noted above, there is also a stable locking point slightly to the left of 0 ppm, shown as false lock point 210B, and, given this false lock point the accumulator will not move left, but simply remain at 0 ppm. Thus, the second-order accumulator will stay stably converged at this false lock point, due to the PD output being 0, and thus the PD will not move the phase of the sampling clock at all, and the CDR will not move leftwards to lock at an accumulator value of −300 ppm. Similarly, while this is commonly not done, if one were to start at the far left of the figure, for example with a second order accumulator value of −800 ppm as shown at 225, the accumulator should ideally accumulate positive values over time and move to the right, towards the locking point 215A at −300 ppm from the other side. However, there is also a stable lock point at about −600 ppm, shown as false lock point 210A. In operation, the second-order accumulator will then, in that example, stay stably converged at this false lock point 210A, due to the PD output being 0 there as well, and thus the PD will not move the phase of the sampling clock at all, and the CDR will not move rightwards to lock at an accumulator value of −300 ppm at real lock point 215A.

It is here noted that the false lock points, e.g., 210A and 210B, are created due to the "kinks" at each of these false lock points. The kinks are due to sinusoidal jitter that is added to the incoming signal for jitter tolerance testing. The location of each kink in the X direction is determined by the sinusoidal jitter ("SJ") frequency, and the height of the kink in the Y direction (e.g., the local maximum and minimum of the average PD output) is a function of the SJ amplitude. For a larger SJ amplitude, higher order "kinks" start to occur at different frequencies. The two kinks shown in FIG. 2 adjacent to each of false lock points 210A and 210B, respectively, are first order kinks. Second order kinks (not shown), for example, would be seen to the left and right of each of the first order kinks. Generally, for generating a jitter tolerance compliance mask, the SJ amplitude may be small.

Thus, the key to avoiding false lock situations is simply to avoid any kinks that intersect with the horizontal PD=0 line 220. It is noted that lowering the loop latency may help by shaping the PD curve, and thus moving these "kinks" to lie above the PD=0 line 220 on the left and below the PD=0 line 220 on the right. This is because the slope to the left of absolute maximum, and the slope to the right of absolute minimum, is gentler when the latency is smaller. When it is gentler, the kinks do not make it past the y=0 line, and thus there are no additional locking points within the ppm locking range required by protocol specifications. However, as there is a limit to how much latency can be reduced, there will also be a corresponding maximum ppm value at which the circuit can be free of false lock points. This limits the maximum ppm achievable by a CDR, and is not an optimal approach.

In one or more examples, to solve this problem, the false lock points may be eliminated by bypassing the "kinks" on the PD=0 line. In one or more examples, this may be done by adding a pre-defined PD offset that is larger than the magnitude of the "kinks", thereby shifting the entire PD curve upwards or downwards, such that the PD=0 line does not intersect with any of the "kinks." It is noted that by "magnitude of a kink" what is meant is the height of the diagonal line, or more strictly, the local maximum PD output value less zero, or zero less the local minimum PD output value, of the diagonal line of the "kink." Essentially, how far the kink extends above, or drops below, the PD=0 line. Expressed mathematically, this is:

$$\text{Mag}_{kink} = \max(PD_{localmax} - 0), (0 - PD_{localmin}).$$

While kink magnitude varies with the channel and the SJ injected, as well as also being a function of the data pattern and the data bus width, kink magnitude is always less than half of either the height of the absolute maximum off of line 220 or the downward drop of the absolute minimum below line 220. Mathematically, $$\text{Mag}_{kink} < 1/2 * \text{Mag}_{absolute} = [\max(PD_{absmax} - 0), (0 - PD_{absmin})]/2.$$

This allows for a clear PD bias or offset to be injected, as next described.

In some examples, the pre-defined PD offset may be set to be larger than the $\text{Mag}_{kink}$ by some safety margin, or at 120-180% of the calculated value of the $\text{Mag}_{kink}$. The effect of this is to move the kinks shown in FIG. 2 above the PD=0 line 220, thus obviating any kink from ever intersecting with that line, and thereby obviating any false lock points. FIG. 3, next described, illustrates the effect of adding such a pre-defined PD offset.

With reference to FIG. 3, the PD average output plot of FIG. 2 has been shifted upwards by an example offset Δ, as shown. It is noted that a positive shift upwards of the plot, by adding positive Δ graphically, actually corresponds to addition of an actual negative valued bias value, or offset, in the first order loop of the circuit, as, for example, may be added by PD bias element 325 in FIGS. 3 and 4. Thus, a graphical offset of the plot, and a corresponding actual PD bias value, are of opposite sign.

Continuing with reference to FIG. 3, on the left of the figure are shown the un-shifted PD output values 251, and on the right side of the figure are shown the shifted PD output values 250. Thus, the various levels of the Y-axis have been relabeled at column 250 to show that the Y-coordinate of every horizontal line of FIG. 2 is now increased by an amount $\Delta$. Thus, what was formerly the line PD=0 220 is now PD=$\Delta$ 221. Because both of the kinks 218A and 218A were crossed by the old PD=0 220 line, and because the added offset $\Delta$ is larger than the magnitude of either kink, the two example kinks have been pushed upwards, and are now crossed only by the horizontal line PD=$\Delta$ 221. Thus, they do not contain any locking points. In the shifted plot of FIG. 3 the line PD=0 220, where locking points must lie, only intersects the diagonal line 215 at the real lock point 215B. Although this real lock point 215B does not have the same ppm register value of −300 ppm as the original real lock point 215A of FIG. 2, the ppm value of real locking point 215B, at about −250 ppm, is very close to it, and, as noted below, in one or more examples the difference (here −50 ppm) is supplied by the PD bias. Thus, in actuality, both 215A and 215B are correct locking points that match the frequency of the transmitter in this example. Even though point 215B shows a converged locking point that is slightly different from the actual system ppm of −300 ppm, the residual ppm not corrected by the second order loop of the CDR circuit (element 340 in FIG. 4) is compensated for by the added PD bias, which, in this example, where the offset to the plot is positive, an additional negative value of PD bias is actually added. Here the additional PD bias is −50 ppm, which is added to the ppm register at point 2158 of −250 ppm, thereby resulting in the correct final frequency of −300 ppm.

Figure 4:
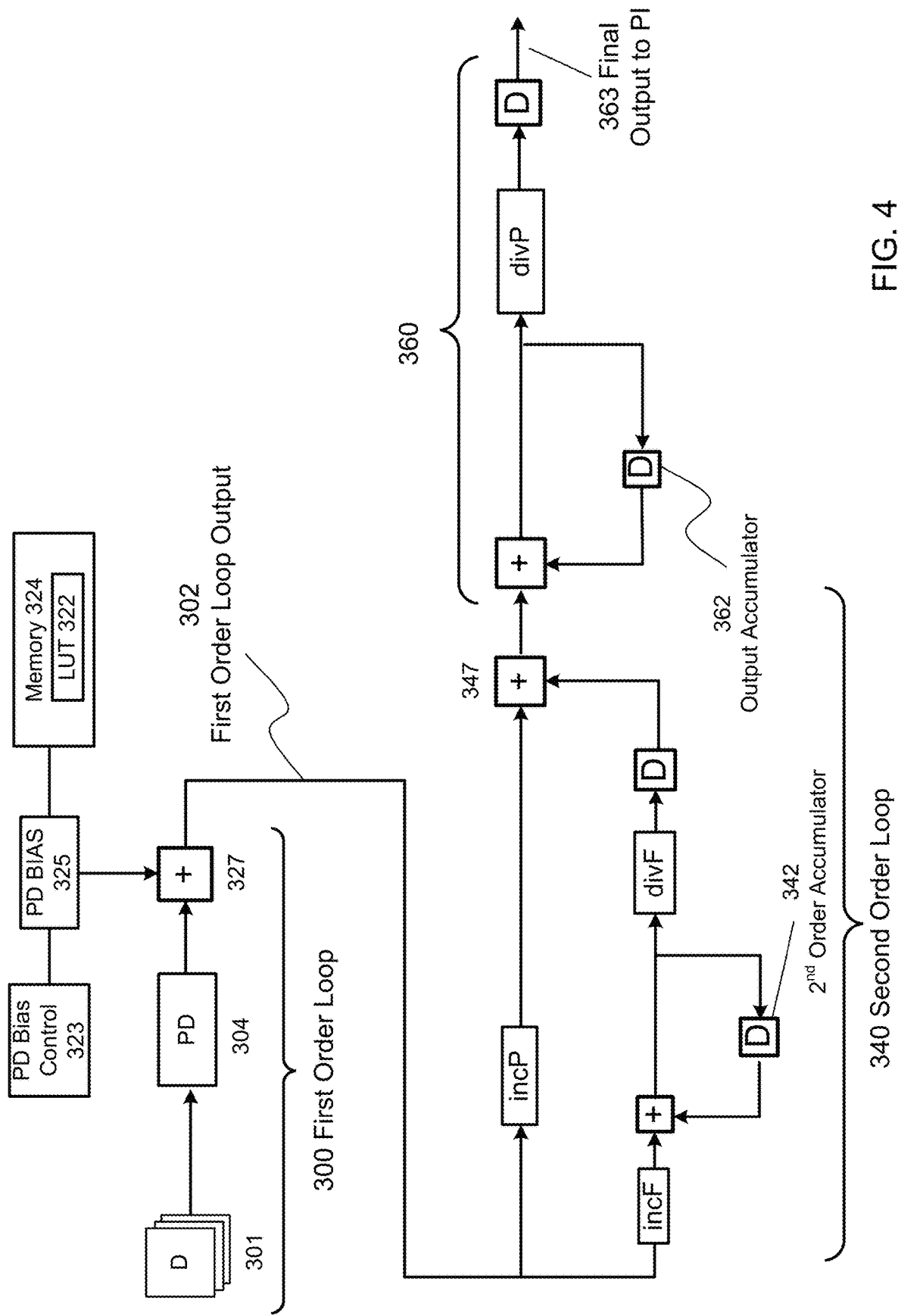
FIG. 4 is an example CDR block diagram, according to an example.

Thus, as used herein, including in the claims, in the context of CDR circuitry the term "offset" or "bias" refers to an added PD bias value to the first order loop output, such as, for example, is shown in FIG. 4 by PD bias 325. As noted above, as used herein in the context of a PD output graph or plot, such as are shown in FIGS. 2 and 3, the term "offset" means adding an offset to the Y value of every point in the plot, and thus conceptually the same thing as "bias", but a graphical "offset" has an opposite sign to the actual numerical PD bias added in the circuitry. Therefore, as noted above, adding negative ppm to the first order loop output, such as, for example, adding −50 ppm as PD bias 325 in FIG. 4, corresponds to pushing the PD output plot 201 in FIGS. 2 and 3 upwards by some positive $\Delta$ that is added to each Y-value of the PD output plot 201. Similarly, a graphical negative offset −$\Delta$, subtracted from each Y-value of a PD output plot, corresponds to an addition in the circuitry of positive ppm as PD bias 325.

Continuing with reference to FIG. 3, it is noted that the intersection of line PD=0 220 with any point on diagonal line 215 would constitute a valid real locking point. Thus, the offset $\Delta$ could be increased or decreased as long as it is not larger than the range of diagonal line 215, which serves as an upper limit on the size of $\Delta$. Also shown in FIG. 3 are the relative magnitudes of $\Delta$ and kink 218B, placed side by side. As noted above, in one or more examples $\Delta$ is to be at least larger than the magnitude of the kinks. In the example case of FIG. 3, the magnitude of pre-defined offset $\Delta$ is approximately 140% the magnitude of kink 218B. Moreover, if the accumulator is biased heavily to one side of the plot, such as, for example, by starting at a low (large negative) value, as shown at 225 in FIG. 3, A needs only to be larger than kink 218A.

In one or more examples, in addition to adding an offset (or bias) to the PD output of an example CDR circuit, the left-right point where the CDR circuit starts out on the curve of FIG. 3 may also be controlled. In one or more examples, a second-order accumulator of the CDR circuit, such as, for example, second order accumulator 342 of FIG. 4, may be initialized with a large negative value (e.g., −500 ppm) so that the accumulator will converge from the left to the right direction in FIG. 3. In some examples, after the CDR circuit has locked to a real lock point, such as for example, real lock point 215B, the PD offset may then be removed from the PD output to restore the optimal lock point 215A of FIG. 2. Because both real lock point 215B and optimal real lock point 215A are on line 215, when the offset is removed the system will simply move along line 215 a bit to the left in FIG. 2, accumulating negative phase, and increase the injected ppm to be the optimal value. In one or more examples, a timer may be used to determine when the system converges on the real lock point. For example, from silicon data and simulations, it may be determined what the longest time is that it takes to acquire lock. The PD bias may be removed after that time. In alternate examples, a pre-defined number X, of consecutive correct data may be detected, and in response to such a detection, it may be ascertained that the CDR has locked correctly, and the PD bias then removed.

It is noted that in one or more examples according to the present invention, there is no maximum ppm limit on the CDR. For example, referring again to FIG. 2, it is noted how at the far right of the plot 201, at a value of about +800 ppm, PD output 201, after being >0 for ppm values >+50 ppm, once again crosses the line PD=0 220 and goes negative, which creates a third false lock point 210C. To address this situation, if a negative PD bias is added (and thus the plot curve moved in the opposite direction to that shown in FIG. 3), so that the PD output is all below 0, to clear that false lock point, then an example system could lock up to very high ppm, as the slope of PD output 201 is very flat following the last zero crossing at 210C.

FIG. 4 is an example CDR block diagram, according to an example. FIG. 4 has three subparts. Beginning at the top left of the figure there is a first order loop 300 which generates a first order loop output 302. The first order loop output 302 is a vote to either increase or decrease the phase value, and may be, for example, either 1, −1, or 0. It is this number whose averaged value over many samples is displayed on the Y-axis of each of FIGS. 2 and 3, described above. The first order loop 300 is shown in magnified view in FIG. 5, described below. It is noted that the output 302 of first order loop 300 includes the added offset PD bias 325, which is analogous to the pre-defined offset $\Delta$ shown in FIG. 3, described above. In the example CDR circuit of FIG. 4, the value of pre-defined offset 325 may be stored in memory 324, which is a memory or storage component, and added to the output of the first order loop at summer 327, as shown.

In one or more examples, the PD bias values to use in the circuit may be stored in a lookup table (LUT), such as LUT 322, stored in memory 324, where the PD bias is provided as a function of the channel, data rate, and data bus width. In some examples, PD bias 325 may even be protocol based, given that different protocols have different training patterns, which may be used to fine-tune the PD bias to target different pattern voting densities. In some examples, once it is determined that the CDR circuit has locked on a real lock point, then the PD bias may be set to zero, and the CDR circuit allowed to move to the optimal lock point. In some examples, the determination of locking at a real lock point may be timer based. Alternatively, in other examples, the determination may be bit error rate based, where the then prevailing bit-error rate is observed. If the prevailing bit-error rate is good, it may then be determined that lock has, in fact, occurred. This determination of successful locking, and the corresponding resetting of PD bias 325 to zero, may be performed by PD bias control 323 as shown. In some examples, PD bias control 323 may include a timer, which, once the time has expired, simply resets PD bias to zero. In other examples, PD bias control 323 may include logic (not shown) that accesses the prevailing bit-error rate, and compares it to a pre-defined threshold, to determine whether or not, and thus when, to remove the PD bias 325.

Continuing with reference to FIG. 4, the first order loop output 302, as augmented by PD bias 325 which is added to it at summer 327, is fed to the second-order loop 340. Referring now to the parallel path through the second-order loop 340, first order loop output 302 is accumulated over many samples in second order accumulator 342. It is this accumulated value, which represents the summation of several first order loop outputs over many samples, that is shown on the X-axis in each of FIGS. 2 and 3, described above. Thus, the second order accumulator 342 is equivalent to the "ppm_register" shown in each of FIGS. 2 and 3. It is noted that the various blocks of FIG. 4 labeled as "D" indicate delay elements, but are here used as accumulators.

Continuing with reference to FIG. 4, it is the content of second-order accumulator 342 that is, after some processing, also input to summer 347 to ultimately generate, in the final part 360 of the CDR circuit, namely in output accumulator 362 (which operates in the manner of a filter) a final output 363 of the CDR circuit, which is then provided as an input to a phase interpolator (PI) to adjust the phase of a sampling clock of the CDR circuit.

In some examples, there may be a "LOAD" element (not shown), for example a register, of the second order (or frequency) loop 340 that may be used to load a programmable initial value into the second-order accumulator 342. This value controls where, in a right-left sense, the CDR circuitry will start out at on the plot of FIGS. 2 and 3.

In the example of FIG. 3, described above, a positive offset Δ was applied to the plot of PD output, which, as noted above, corresponds to addition of a negative PD bias value in the circuitry, and a large negative value was injected into the ppm register (equivalent to second order accumulator 342). This insured that the CDR circuit would begin operating at the left side of the PD output curve 201 and move towards the center to the real lock point 215B. In alternate examples, where a negative offset is applied to the graph, and thus the kinks moved downwards (the opposite of that shown in FIG. 3), to all be below the PD=0 220 line, it is then desired to begin the circuit at the far right of the figure and move towards the center to lock at the real lock point on line 215. Thus, in examples where a positive PD offset is added to the plot or graph, corresponding to addition of a negative PD bias value as PD bias 325, then the second order accumulator 342 is to be initialized with a large negative accumulator value, as in the example of FIG. 3. Conversely, if a negative PD offset is added to the plot or graph (pulling the PD output curve downwards), which corresponds to the addition of a positive PD bias value added as PD bias 325, then the second order accumulator 342 is to be initialized with a large positive accumulator value.

In comparison to conventional solutions, techniques according to the present disclosure are both easy to implement and theoretically have no hard limit as to ppm range. Compared to conventional approaches, the present techniques are both simple and elegant. For example, latency reduction requires multiple circuit blocks to be tweaked, and even if this is done, there is a hard limit to the improvement obtained. Or, for example, various "brute force" detect-reset-retry algorithms require more complex state machine (power/area) to identify and calculate a value to load to the second-order accumulator and then retry.

Figure 5:
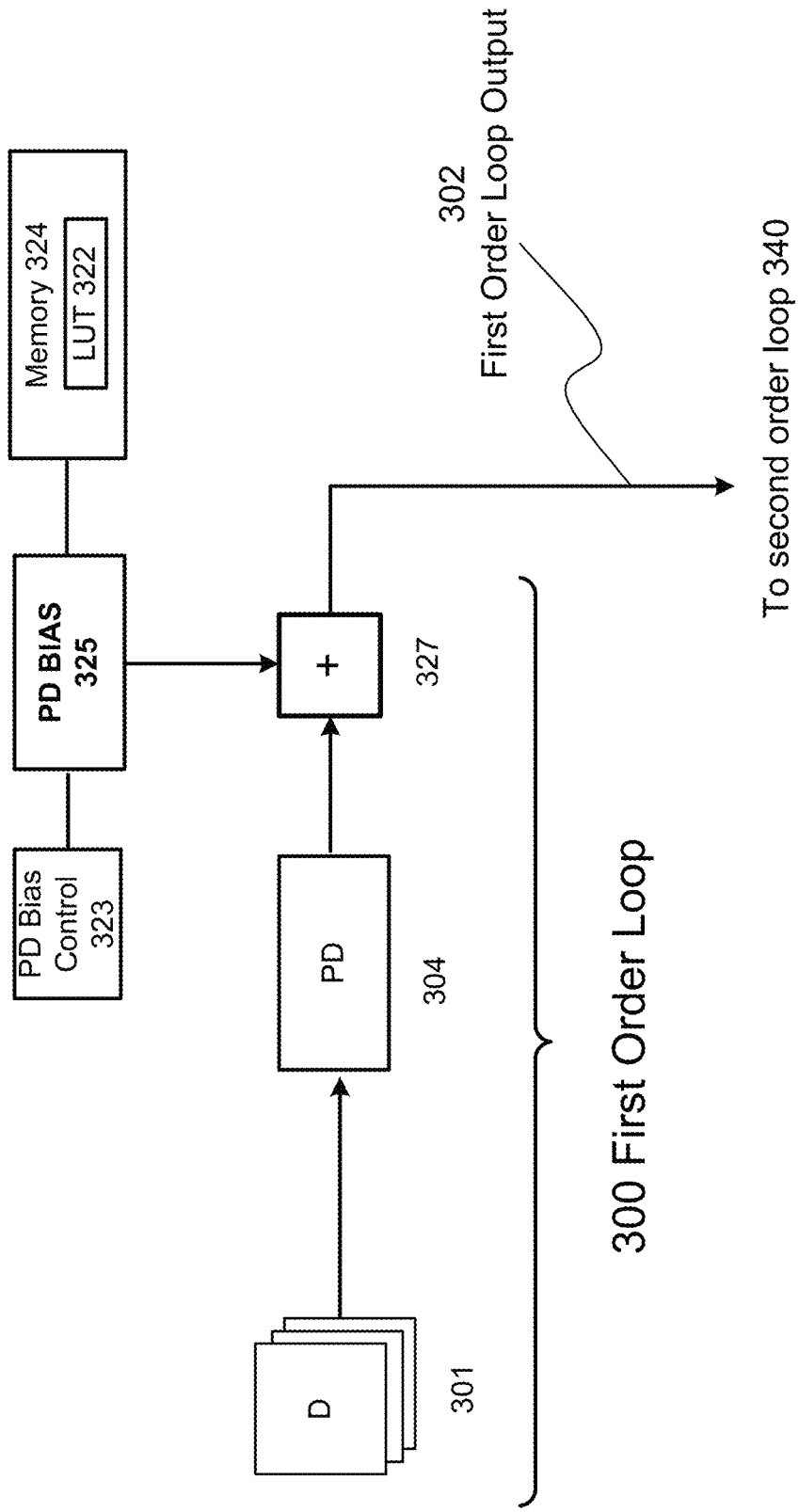
FIG. 5 is a magnified version of a phase detector loop of the CDR bock diagram of FIG. 4.

FIG. 5 is a magnified version of the phase loop of the CDR bock diagram of FIG. 4. It is first noted that FIGS. 4 and 5 depict an example CDR circuit that may be used with a PAM4 input signal. It is further noted, however, that the technique of adding an offset to the phase loop output is not limited to any particular CDR circuit and that the circuit of FIGS. 4 and 5 is merely provided as an example.

Continuing with reference to FIG. 5 there are therefore shown samples 301 being provided to a phase detector (PD) 304 whose output is coupled to a summer 327. Summer 327 also takes as an input an offset value PD bias 325, which, as shown, may be provided by a LUT 322 stored in a memory 324. Summer 327 sums the two inputs and generates first order loop output 302, which now includes the added PD offset.

Figure 6:
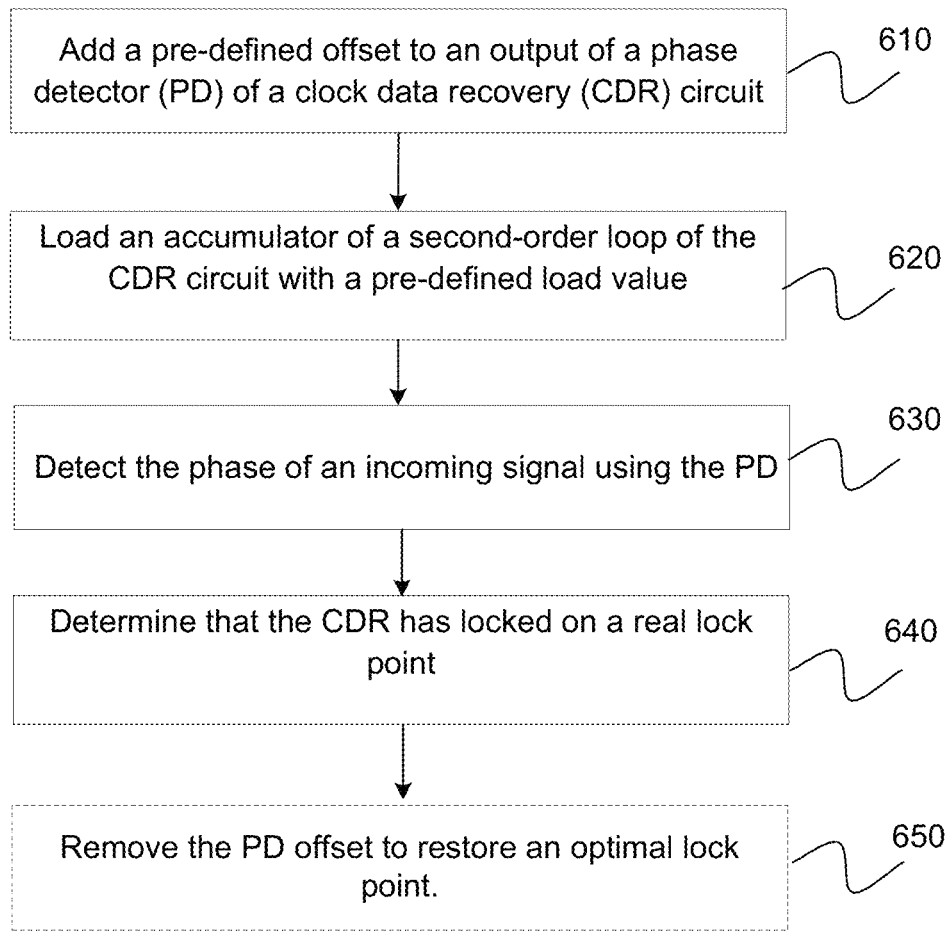
FIG. 6 is a flow diagram depicting a method of CDR according to an example.

FIG. 6 is a flow diagram depicting a method 600 of CDR according to an example. The method includes blocks 610 through 640, and additional optional block 650. In alternate examples of the method, there may be greater, or fewer, blocks. The method 600 begins at step 610, where a pre-defined offset is added to an output of a phase detector (PD) of a clock data recovery (CDR) circuit. For example, the pre-defined offset may be a PD bias 325, as described above with reference to FIGS. 4 and 5, described above. In some examples, corresponding to the PD output plot of FIGS. 2 and 3, the PD bias may be −50 ppm, for example. From block 610, method 600 proceeds to block 620, where an accumulator of a second-order loop of the CDR circuit is loaded with a pre-defined load value. For example, the pre-defined load value may be −800 ppm, or −600 ppm, or something similar. From block 620, method 600 proceeds to block 630, where the phase of an incoming signal using the PD, as enhanced by a biasing element that adds the pre-defined offset, is detected. From block 630, method 600 proceeds to block 640, where it is determined that the CDR has locked on a real lock point. For example, the real lock point may be lock point 215B of FIG. 3, and, as noted above, in some examples, the determination of locking at the real lock point may be timer based. Alternatively, in other examples, the determination may be bit error rate based, where the then prevailing bit-error rate is observed. If the prevailing bit-error rate is good, it may then be determined that lock has, in fact, occurred. Method 600 may optionally terminate at block 640, inasmuch as it has been verified that the CDR circuit converged on an actual lock point, and the circuit may be allowed to run without further management or interference. However, given the magnitude of the pre-defined offset, the ppm value for the real lock point may be appreciably different than the ppm value for an optimal lock point, which the CDR circuit would optimally lock on in absence of any kinks. To address such cases, method 600 may also include optional block 650 (shown in a dashed line to indicate that it is optional).

In the case that method 600 does include optional block 650, then, from block 640 method 600 proceeds to block 650, where the PD offset of block 610 is removed to restore an optimal lock point of the CDR circuit. For example, graphically, if the PD offset Δ of FIG. 3 is removed, then the lock point will not be 215B, at −250 ppm, of FIG. 3 but rather the optimal lock point 215A, at −300 ppm, as shown in FIG. 2. As may be seen by comparison, optimal lock point 215A has a slightly more negative ppm value than does the real lock point 215B arrived at under the application of the pre-defined offset. Thus, in one or more examples, if optional block 650 is included in method 600, then once the CDR circuit converges on any real lock point (e.g., one that lies on diagonal line 215 of FIGS. 2 and 3) the PD offset may be removed, for example by PD bias control 323 of FIGS. 4 and 5, and the CDR circuit allowed to naturally converge to its optimal lock point, now that the false lock possibility due to the kinks has been obviated. Method 600 then terminates at block 650.

Figure 7:
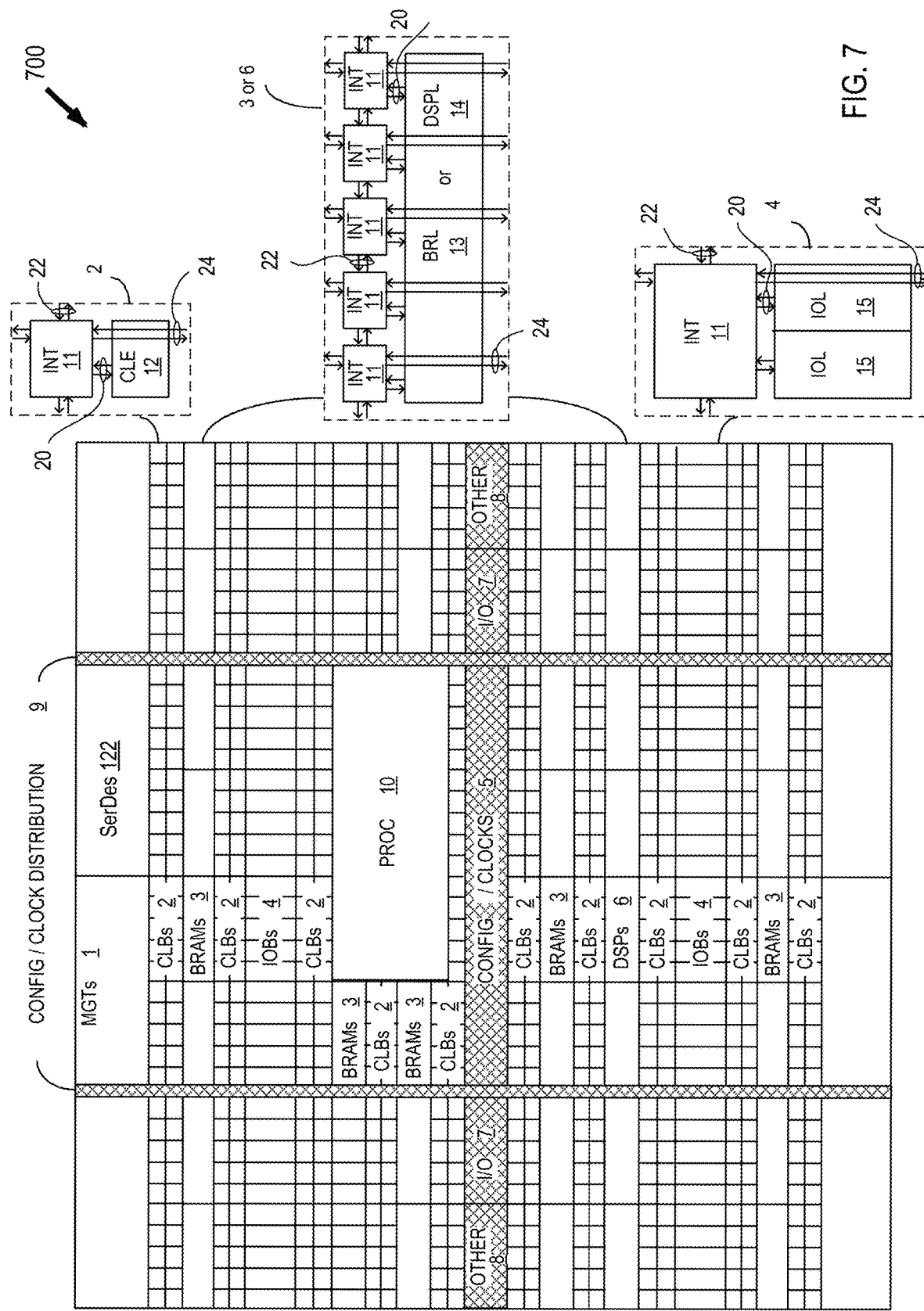
FIG. 7 illustrates an architecture of field programmable gate array in which example receivers described herein may be employed.

In one or more examples, the SerDes 122 described above with reference to FIG. 1 may be implemented within an integrated circuit, such as a field programmable gate array (FPGA) or like type programmable circuit. FIG. 7 illustrates an architecture of FPGA 700 that includes a large number of different programmable tiles including multi-gigabit transceivers ("MGTs") 1, configurable logic blocks ("CLBs") 2, random access memory blocks ("BRAMs") 3, input/output blocks ("IOBs") 4, configuration and clocking logic ("CONFIG/CLOCKS") 5, digital signal processing blocks ("DSPs") 6, specialized input/output blocks ("I/O") 7 (e.g., configuration ports and clock ports), and other programmable logic 8 such as digital clock managers, analog-to-digital converters, system monitoring logic, and so forth. Some FPGAs also include dedicated processor blocks ("PROC") 10. FPGA 700 can include one or more instances of SerDes 122 described above.

In some FPGAs, each programmable tile can include at least one programmable interconnect element ("INT") 11 having connections to input and output terminals 20 of a programmable logic element within the same tile, as shown by examples included at the top of FIG. 7. Each programmable interconnect element 11 can also include connections to interconnect segments 22 of adjacent programmable interconnect element(s) in the same tile or other tile(s). Each programmable interconnect element 11 can also include connections to interconnect segments 24 of general routing resources between logic blocks (not shown). The general routing resources can include routing channels between logic blocks (not shown) comprising tracks of interconnect segments (e.g., interconnect segments 24) and switch blocks (not shown) for connecting interconnect segments. The interconnect segments of the general routing resources (e.g., interconnect segments 24) can span one or more logic blocks. The programmable interconnect elements 11 taken together with the general routing resources implement a programmable interconnect structure ("programmable interconnect") for the illustrated FPGA.

In an example implementation, a CLB 2 can include a configurable logic element ("CLE") 12 that can be programmed to implement user logic plus a single programmable interconnect element ("INT") 11. A BRAM 3 can include a BRAM logic element ("BRL") 13 in addition to one or more programmable interconnect elements. Typically, the number of interconnect elements included in a tile depends on the height of the tile. In the pictured example, a BRAM tile has the same height as five CLBs, but other numbers (e.g., four) can also be used. A DSP tile 6 can include a DSP logic element ("DSPL") 14 in addition to an appropriate number of programmable interconnect elements. An IOB 4 can include, for example, two instances of an input/output logic element ("IOL") 15 in addition to one instance of the programmable interconnect element 11. As will be clear to those of skill in the art, the actual I/O pads connected, for example, to the I/O logic element 15 typically are not confined to the area of the input/output logic element 15.

In the pictured example, a horizontal area near the center of the die (shown in FIG. 7) is used for configuration, clock, and other control logic. Vertical columns 9 extending from this horizontal area or column are used to distribute the clocks and configuration signals across the breadth of the FPGA.

Some FPGAs utilizing the architecture illustrated in FIG. 7 include additional logic blocks that disrupt the regular columnar structure making up a large part of the FPGA. The additional logic blocks can be programmable blocks and/or dedicated logic. For example, processor block 10 spans several columns of CLBs and BRAMs. The processor block 10 can include various components ranging from a single microprocessor to a complete programmable processing system of microprocessor(s), memory controllers, peripherals, and the like.

Note that FIG. 7 is intended to illustrate only an exemplary FPGA architecture. For example, the numbers of logic blocks in a row, the relative width of the rows, the number and order of rows, the types of logic blocks included in the rows, the relative sizes of the logic blocks, and the interconnect/logic implementations included at the top of FIG. 7 are purely exemplary. For example, in an actual FPGA more than one adjacent row of CLBs is typically included wherever the CLBs appear, to facilitate the efficient implementation of user logic, but the number of adjacent CLB rows varies with the overall size of the FPGA.

Thus, in one or more examples, false lock points due to there being kinks in the PD average output plot are obviated by adding a pre-defined offset value to the PD output. While other conventional solutions such as reducing latency (change PD profile) and detect-reset-retry algorithms were used, they are more complex to implement and their results not as robust. In alternate examples, techniques according to the present disclosure may be applied to other CDR algorithms such as, for example, 2× over-sampling. Moreover, such techniques may be used for other modulation schemes besides NRZ or PAM4, such as, for example, PAM8 and DSQ if their PD profiles have similar multiple dead zone issues.

The inventors hereof discovered the secondary lock points in CDR systems, and their causes, and thus implemented dynamic modification of the PD profile to remove such dead zones.

While the foregoing is directed to specific examples, other and further examples may be devised without departing from the basic scope thereof, and the scope thereof is determined by the claims that follow.

What is claimed is:

1. A method of clock and data recovery ("CDR"), comprising:
  adding a pre-defined static offset to each output of a phase detector (PD) of a CDR circuit, the pre-defined static offset having a magnitude larger than a magnitude of a kink adjacent to a false lock point in a plot of average PD value for the PD;
  loading an accumulator of a frequency loop of the CDR circuit with a pre-defined load value;
  detecting a phase of an incoming signal using the phase detector ("PD"); and determining that the CDR has locked onto a real lock point.

2. The method of claim 1, wherein the determining further comprises determining that the frequency loop of the CDR circuit has locked onto a real lock point.

3. The method of claim 1, wherein the pre-defined static offset has a magnitude larger than a difference between a local maximum of the plot of average PD value adjacent to the false lock point and 0.

4. The method of claim 3, wherein the pre-defined offset has a magnitude less than a difference between a maximum of the plot of average PD value and 0.

5. The method of claim 4, wherein the pre-defined offset has a magnitude≤a difference between a maximum of the plot of average PD value and 0.

6. The method of claim 1, wherein the pre-defined offset has a magnitude larger than a difference between 0 and a local minimum of the plot of average PD value adjacent to a false lock point.

7. The method of claim 6, wherein the pre-defined offset has a magnitude less than a difference between 0 and a minimum of the plot of average PD value.

8. The method of claim 1, wherein the pre-defined load value is selected so as to be larger than a protocol ppm requirement of the CDR circuit.

9. The method of claim 1, further comprising:
based on a determination that the CDR has locked onto a real lock point, removing the PD offset.

10. The method of claim 9, further comprising setting a timer for a pre-defined time period and removing the PD offset at an end of the time period.

11. The method of claim 10, wherein the pre-defined time is determined from at least one of silicon data and simulations as a longest time it takes for the CDR circuit to acquire lock.

12. A clock and data recovery (CDR) circuit, comprising:
an input configured to receive an incoming digital signal;
a phase detector (PD) coupled to the input, configured to detect a phase of the incoming digital signal and generate a PD output;
a summer coupled to the output of the PD, configured to add a pre-defined static offset to each PD output, the pre-defined static offset having a magnitude larger than a magnitude of a kink adjacent to a false lock point in a plot of average PD value for the PD; and
a frequency loop coupled to an output of the summer, configured to receive and accumulate the PD output, as offset, over a plurality of samples of the digital signal.

13. The CDR circuit of claim 12, further comprising circuitry, configured to determine that the CDR locked on a real lock point.

14. The CDR circuit of claim 13, further comprising circuitry configured to, based on a determination that the CDR locked on a real lock point, modify the pre-defined offset to equal zero.

15. The CDR circuit of claim 13, wherein the circuitry includes a timer, and is further configured to determine that the CDR has locked onto a real lock point at an expiration of a pre-determined time.

16. The CDR circuit of claim 13, wherein the circuitry is configured to check a then prevailing bit-error rate, and based on the bit-error rate being less than a predetermined threshold, determine that the CDR has locked onto a real lock point.

17. The CDR circuit of claim 12, further comprising a memory, and wherein the pre-defined offset is obtained from a look up table (LUT) stored in the memory.

18. The CDR circuit of claim 17, wherein the LUT includes pre-defined offset values as a function of at least one of:
channel, data rate, data bus width or modulation protocol.

19. The CDR circuit of claim 12, wherein the pre-defined offset value has a magnitude larger than a difference between a local maximum of a plot of average PD value adjacent to a false lock point and 0.

20. The CDR circuit of claim 19, wherein the pre-defined offset value has a magnitude less than a difference between a maximum of the plot of average PD value and 0.

* * * * *